(12) United States Patent
Chehadi

(10) Patent No.: US 6,437,609 B1
(45) Date of Patent: Aug. 20, 2002

(54) CHARGE PUMP TYPE VOLTAGE BOOSTER CIRCUIT

(75) Inventor: Mohamad Chehadi, Aix en Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/693,180

(22) Filed: Oct. 20, 2000

(30) Foreign Application Priority Data

Oct. 22, 1999 (FR) .............................. 99 13391

(51) Int. Cl.⁷ ................................................. H03D 3/00
(52) U.S. Cl. ........................ 327/102; 327/103; 327/589; 327/536
(58) Field of Search ................................ 327/102, 103, 327/104, 306, 536, 537, 589; 323/313; 326/88, 92

(56) References Cited

U.S. PATENT DOCUMENTS

| | | | | |
|---|---|---|---|---|
| 4,403,158 A | * | 9/1983 | Slemmer | .................... 327/536 |
| 5,285,370 A | | 2/1994 | Axer et al. | .................... 363/59 |
| 5,371,444 A | * | 12/1994 | Griffin | .................... 315/291 |
| 5,861,772 A | * | 1/1999 | Lee | .................... 327/589 |

FOREIGN PATENT DOCUMENTS

| | | | | |
|---|---|---|---|---|
| EP | 0596124 | 5/1994 | .......... | G06K/19/00 |
| FR | 2752076 | 2/1998 | .......... | G06K/19/07 |
| FR | 2752318 | 2/1998 | ............ | G06K/7/08 |

* cited by examiner

Primary Examiner—Tuan T. Lam
Assistant Examiner—Hiep Nguyen
(74) Attorney, Agent, or Firm—Lisa K. Jorgenson; Allen, Dyer, Doppelt, Milbrath & Gilchrist, P.A.

(57) ABSTRACT

An integrated circuit card receives power in the form of a radio frequency signal and includes a voltage generator that produces a first power supply voltage. The card also includes a voltage booster circuit for producing a high voltage that receives the first power supply voltage at a first supply input terminal. The voltage booster circuit also receives a second power supply voltage higher than the first power supply voltage at a second supply input terminal.

31 Claims, 5 Drawing Sheets

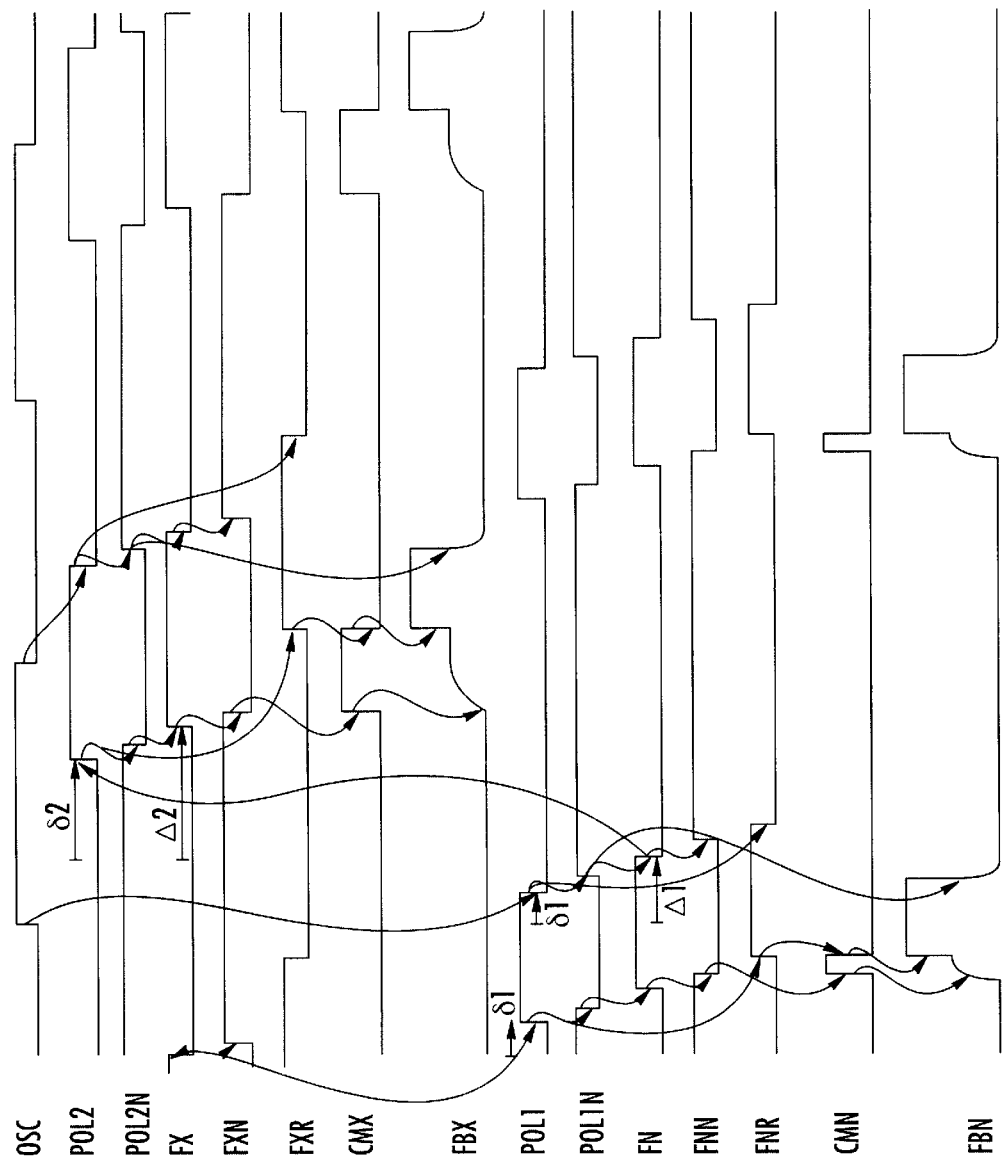

CHARGE PUMP TYPE VOLTAGE BOOSTER CIRCUIT

FIELD OF THE INVENTION

The invention relates to electronic circuits requiring a voltage higher than a low supply voltage that powers these circuits. The invention is more particularly applicable to charge pump type voltage booster circuits used in chip cards.

BACKGROUND OF THE INVENTION

An exemplary type of application of a circuit using a voltage higher than its low supply voltage is that of an integrated circuit including a non-volatile memory with floating-gate transistors. In these integrated circuits, a high voltage is needed to program and/or erase the memory. The programming and/or erasure of these memories requires a programming or erasure voltage of about 18 V, which is far higher than the low power supply voltage Vcc. The supply voltage Vcc may be about 3 V, for example. To avoid making the user provide the high voltage of 18 V, the integrated circuit is designed to have internal means for producing the high voltage from the low supply voltage Vcc. For this purpose, it is common practice to use a voltage booster circuit based upon the "charge pump" principle.

FIG. 1a is a schematic diagram of a known charge pump structure including a set of N series-connected elementary cells CE1 to CEN. Each elementary cell has two input terminals E1 and E2, two output terminals S1 and S2, and two clock input terminals CK1 and CK2. The high voltage HV is provided at the output terminal S1 of the Nth elementary cell. The clock inputs CK1 and CK2 of the elementary cells CE1 to CEN alternately receive four selection switch signals FN1, FN2, FX1 and FX2 produced by a control circuit 130 from a clock signal OSC. The control circuit 130 is powered by the supply voltage Vcc of the circuit. An oscillator 140 produces the clock signal OSC from the supply voltage Vcc. It is known in the art to make such an oscillator from inverters and filters. Yet, it is difficult to make a frequency-stable oscillator.

An elementary cell CE of the charge pump, illustrated in FIG. 1b, includes two transistors Ta and Tb and two capacitors Ca and Cb. A terminal of the capacitor Ca, the drain of the transistor Ta, and the drain of the transistor Tb are connected together to the input terminal E1. Similarly, the control gate of the transistor Ta, the source of the transistor Tb, and a terminal of the capacitor Cb are connected together to the input terminal E2. The source of the transistor Ta and the control gate of the transistor Tb are connected respectively to the output terminals S1 and S2. Finally, the other terminal of the capacitor Ca and the other terminal of the capacitor Cb are connected respectively to the clock input terminals CK1 and CK2. In practice, the capacitors Ca and Cb are each made from transistors whose control gates correspond to a terminal of the capacitors and whose drains and sources, which are connected together, correspond to the other terminal of the capacitors.

The selection switch signals FN1, FN2, FX1 and FX2 are shown in FIG. 1c. The first and third selection switch signals FN1 and FX1 are two complementary selection switch signals but are not overlapping in the high state. They switch between two values, which are substantially 0 and a first voltage level VA. The second and fourth selection switch signals FN2 and FX2, which are not overlapping in the high state, are signals respectively synchronized with the first and third selection switch signals FN1, FX1. They switch between two values, which are substantially 0 and a second voltage value VB.

Assuming that the selection switch signals FN1 and FN2 are initially at VA and VB and that the selection switch signals FX1 and FX2 are initially at 0 V, the selection switch signals FN1, FN2, FX1 and FX2 are such that: the falling of the signal FN2 to 0 V leads to the falling of the signal FN1 to 0 V; the falling of the signal FN1 to 0 V leads to the rising of the signal FX1 to VA; the rising of the signal FX1 to VA leads to the rising of the signal FX2 to VB, which falls back to 0 V after a period of time; the falling of the signal FX1 to 0 V leads to the rising of the signal FN1 to VA; and the rising of the signal FN1 to VA leads to the rising of the signal FN2 to VB.

With the high voltage HV being obtained, the working time and the losses of the charge pump, as well as the total energy that it consumes to give the voltage HV, essentially depend on a number of factors. These factors are the number N of elementary cells, the supply voltage Vcc, and the threshold voltage VT of the transistors Ta, Tb used and the voltage levels VA, VB. Of course, it is desirable to obtain a sufficiently high voltage HV without excessively increasing the number N of elementary cells used. To do so, it is the general practice to choose a voltage level VA that is equal to the supply voltage Vcc and a voltage level VB that is as high as possible. The voltage level VB depends, inter alia, on the number N of elementary cells and on the maximum voltage to be allowed to go through the transistors TA, TB. The value of VB must be limited to not disrupt the gate oxides of the transistors. Yet, in practice, the control circuits do not provide for a voltage level VB higher than twice the supply voltage Vcc.

The problem of the total consumption of energy from the charge pump is vital particularly for applications known as contactless applications. In such application, the total energy is given remotely by a reader in the form of a radio frequency signal. The energy received by the card is limited and greatly decreases when the distance between the reader and the card increases. If it is desired to use the card at a reasonable distance from the reader, then it is necessary to limit the total energy consumption of the charge pump type voltage booster circuits used in contactless applications.

SUMMARY OF THE INVENTION

To this end, the invention proposes an integrated circuit card receiving power in the form of a radio frequency signal. The integrated circuit card may include a voltage generator that produces a first power supply voltage and a voltage booster circuit. The voltage booster circuit receives the first power supply voltage at a first supply input terminal thereof, receives a second power supply voltage higher than the first power supply voltage at a second supply input terminal thereof, and produces a high voltage.

According to one embodiment, the voltage generator may include a detection and rectifier circuit that receives the radio frequency signal and produces a rectified voltage at an output terminal thereof. A first regulator may receive the rectified voltage at a supply input terminal thereof and produce the first supply voltage. The second supply input terminal of the voltage booster circuit may be connected to the power supply input terminal of the first regulator, where the second power supply voltage is equal to the rectified voltage.

The integrated circuit card may also include a second regulator with an input terminal connected to the output terminal of the detection and rectifier circuit to receive the rectified voltage and an output terminal connected to the power input terminal of the first regulator. The second regulator receives the rectified voltage and produces the second power supply voltage, and the first regulator receives the second power supply and produces the first power supply voltage.

The voltage booster circuit may include a control circuit that produces at least one pair of selection switch signals.

The first selection switch signal may oscillate between a zero voltage and a first voltage level, and the second selection switch signal may oscillate between a zero voltage and a second voltage level. The control circuit may receive the first and second power supply voltages. Also, the first and second voltage levels may be obtained respectively from the first and second power supply voltages.

The voltage booster circuit may further include N series-connected elementary cells for producing the high voltage. The N elementary cells may be controlled by the at least one pair of selection switch signals. The control circuit may include a phase separation circuit that receives a clock signal and a first supply voltage and produces a first selection switch signal.

The control circuit may also include at least one raising circuit that receives a first selection switch signal and the first and second supply voltages and produces the second selection switch signal by raising the level of the first selection switch signal. The phase separation circuit may also produce at least one logic signal representing the logic state of the first selection switch signal. The N elementary cells may be driven either by at least one pair of selection switch signals or by the first selection switch signal and the at least one logic signal. Furthermore, the integrated circuit card may include a clock signal generator that receives the radio frequency signal and produces the clock signal.

The invention thus proposes the use of two different power supply voltages to supply one charge pump which consumes, on the whole, less energy and also for a shorter period. Indeed, by using two power supply voltages, one of which is higher than the other, the invention increases the level of voltage reached by the selection switch signals. As a result, the voltage applied to the gates of the transistors of the elementary cells of the charge pump is increased. The desired high voltage HV is thus obtained quicker, and the total energy consumption is reduced. The number of elementary cells may be reduced, thus bringing about a corresponding reduction in the total size in terms of silicon surface area of the voltage booster circuit. Furthermore, by using two power supply voltages, the power consumed by the charge pump is distributed between two voltage sources which produce them. Thus, the risk of a collapse of either of these sources is reduced.

The invention is particularly useful for integrated circuit cards where it is easy to obtain two voltages from a single radio frequency signal received by the card. For example, for a chip card at about 50 cm from a reader, using present-day solutions and with a voltage supply Vcc of about 3 V, the charge pump consumes energy for about 50 µs to give a high voltage HV of about 18 V. The charge pump of the invention, by using two supply voltages (e.g., a 3 V supply and a 5 V supply) consumes energy for only about 10 µs and produces a high voltage HV of about 18 V. Furthermore, this is accomplished without reducing the distance between the reader and the chip card.

Another advantage of the invention is that it eliminates the oscillator commonly used to give the clock signal. For this purpose, the invention uses a clock signal generator which, from a radio frequency signal with a frequency f0 received by the card, produces a clock signal with a frequency f=f0/p, where p is an integer. Conventionally, the frequency f0 is equal to 13.56 MHZ. A clock signal generator of this kind has the advantage of giving a clock signal that is particularly stable in frequency, inasmuch as the frequency f0 of the radio frequency signal received by the card is stable. This approach reduces the problems of frequency stability found in the commonly used oscillator. According to the present invention, the circuits of the charge pump no longer need to be sized to account for the variable frequency clock signals. This reduces the total size (in terms of silicon surface area) of the charge pump.

Furthermore, with a clock signal generator of this kind it is possible to reduce the frequency of the clock signal by choosing a number p greater than 1, for example equal to 8 (giving a clock signal with a frequency f=1.7 MHZ). This further reduces the total energy consumption of the charge pump.

BRIEF DESCRIPTION OF THE DRAWINGS

The invention will be understood more clearly, and other characteristics and advantages will become apparent, from the following description, made with reference to the appended drawings, in which:

FIG. 1b is a detailed schematic diagram of a base cell of the charge pump of FIG. 1a;

FIG. 1c illustrates waveform diagrams of selection switch signals of the charge pump of FIG. 1a;

DETAILED DESCRIPTION OF THE PREFERRED EMBODIMENTS

Figure 2:
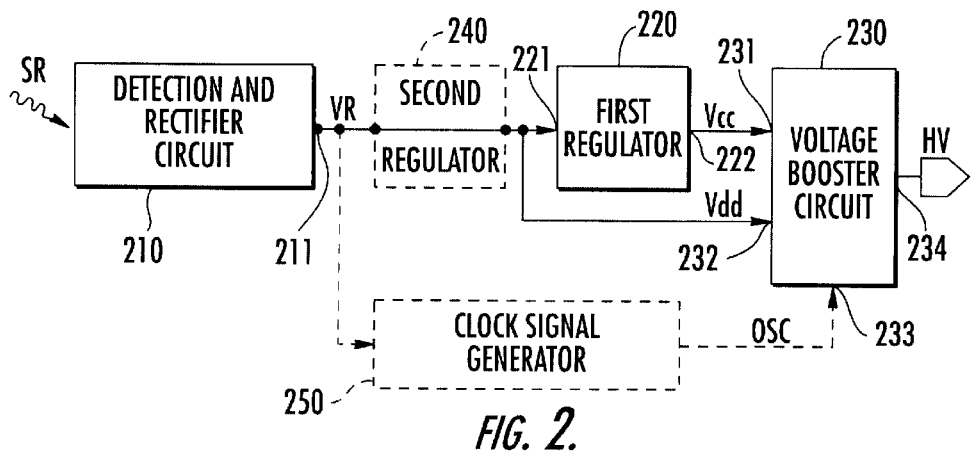
FIG. 2 is a schematic block diagram of an integrated circuit card according to the invention.

An integrated circuit card according to the invention is shown in FIG. 2. The integrated circuit card includes a detection and rectifier circuit 210, a first regulator 220, a voltage booster circuit 230 and a second regulator 240. The detection and rectifier circuit 210 receives a radio frequency signal SR and provides a rectified voltage VR at an output terminal 211. The detection and rectifier circuit 210 may be of a type known in the art and include an antenna to receive the radio frequency signal SR and a diode bridge to provide the rectified voltage VR. The detection and rectifier circuit 210 may also include filters to improve its operation.

The voltage booster circuit 230, which is a charge pump type of circuit, has two supply input terminals 231, 232 to which first and second supply voltages Vcc, Vdd are applied, respectively. The voltage booster circuit 230 includes a clock input 233 to which a clock signal OSC is applied, and it provides a high voltage HV at an output terminal 234. The first regulator 220 has an input terminal 221 and an output terminal 222 connected respectively to the supply input terminals 232 and 231. The first regulator 220 may be of a type known in the art, and it may include a voltage detector and filters to regulate the first supply voltage Vcc (for example at 3 V), and the regulated voltage is provided at an output terminal 222 thereof.

The second regulator 240 has an input terminal connected to the output terminal 211 to receive the rectified voltage VR and an output terminal connected to the input terminal 221. The second regulator 240 may also be of a type known in the art and similar to the first regulator 220. The second regulator provides the second stable supply voltage Vdd, equal to about 4.5 V, for example.

The second regulator 240 is not indispensable to the working of the invention, but does improve it. It is indeed possible to consider powering the voltage booster circuit 230 with the first power supply voltage Vcc, which is stable, and the second power supply voltage Vdd, which is equal to the rectified voltage VR. However, especially for contactless card applications, the voltage level of the rectified voltage VR varies greatly with the distance between the reader and the card. In this case, it will be necessary to oversize the elements of the voltage booster circuit 230 so that they withstand variations in rectified voltage VR. To avoid this constraint, a second voltage regulator 240 may be used to provide a second stable supply voltage VDD.

Figure 1A:
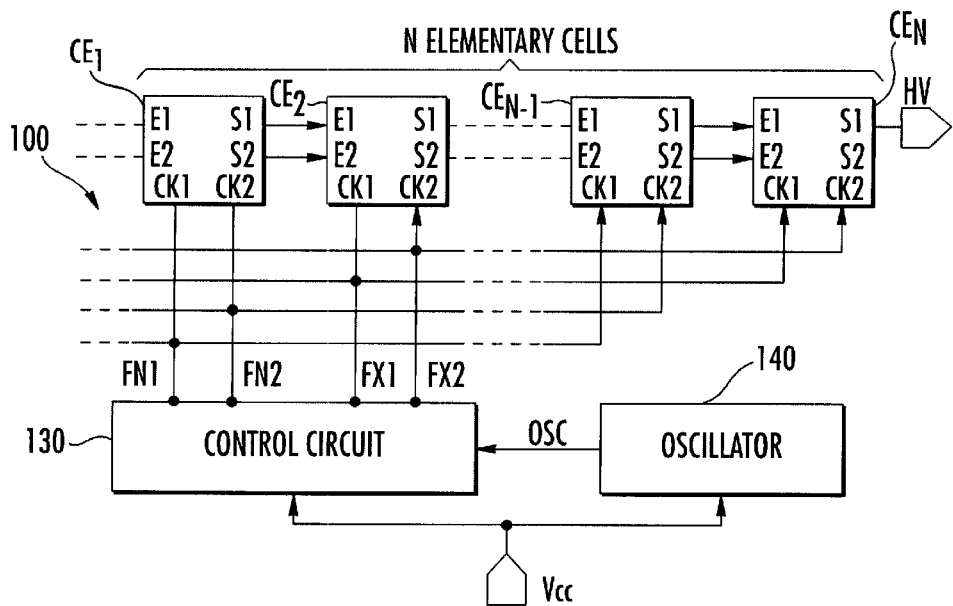
FIG. 1a is a schematic diagram of a charge pump type of voltage booster circuit according to the prior art.
Figure 1B:
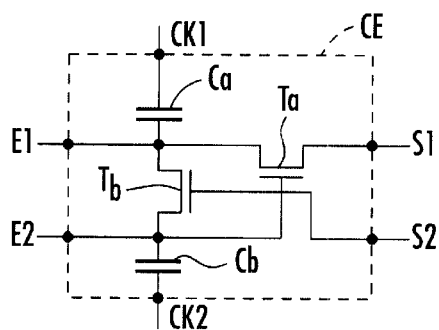
Figure 3:
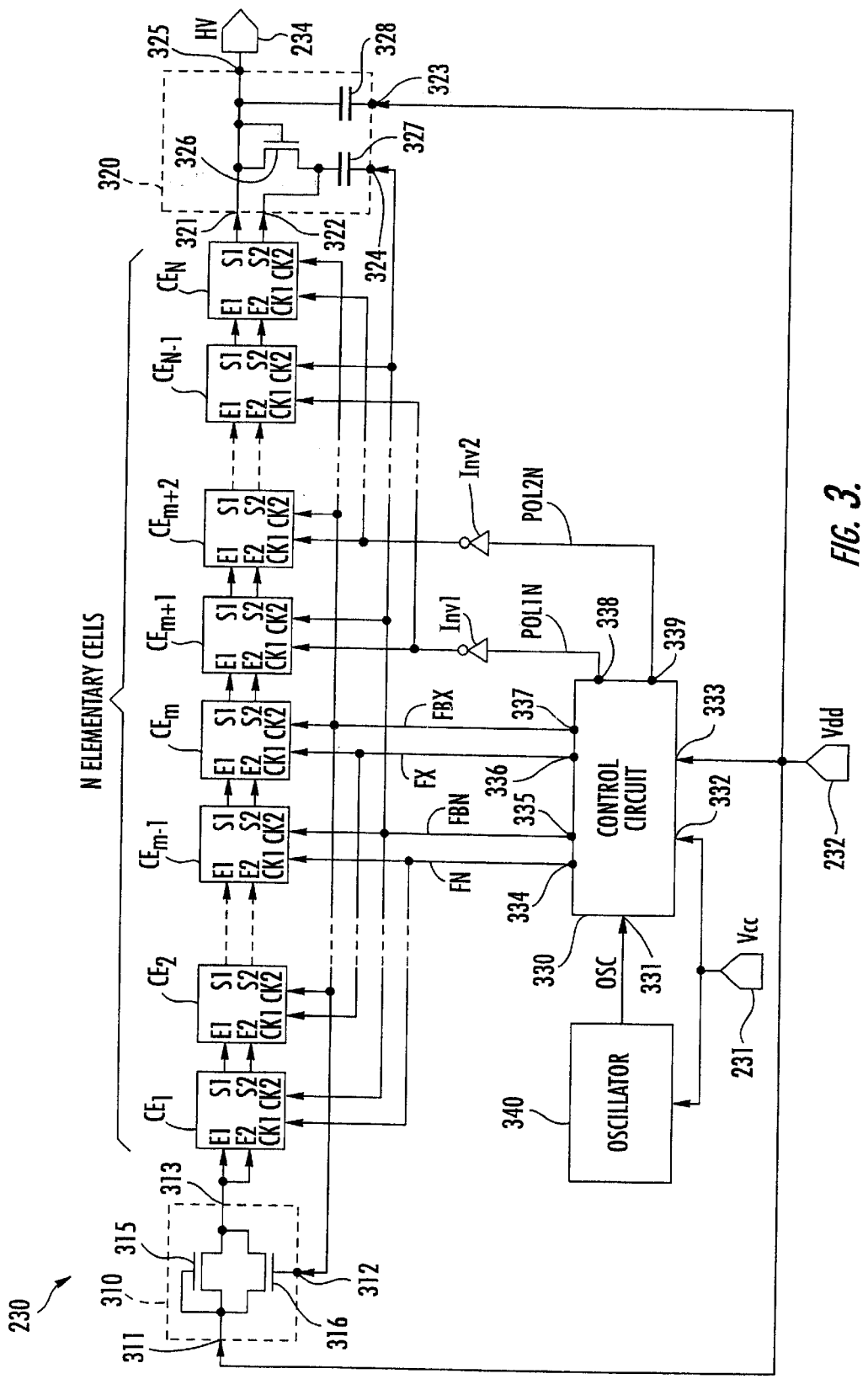
FIGS. 3 to 8 are schematic diagrams illustrating certain elements of the integrated circuit card of FIG. 2, FIGS. 9a to 9o are timing diagrams of signals at different locations of the circuits shown in FIGS. 2 to 7.

The voltage booster circuit 230 of the invention is a charge pump, as shown in FIG. 3. That is, the voltage booster circuit includes N elementary cascade-connected cells CE1 to CEN. Each elementary cell is identical to cell illustrated in FIG. 1*b* and has two input terminals E1 and E2, two output terminals S1 and S2, and two clock input terminals CK1 and CK2. The inputs E1 and E2 of each elementary cell CE2 through CEN are respectively connected to the outputs S1 and S2 of the prior elementary cell, i.e., CE1 though CEN-1.

The charge pump of FIG. 3 also includes an input circuit 310, an output circuit 320, a control circuit 330, and an oscillator 340. The input circuit 310 has a supply input terminal 311 connected to the supply input terminal 232 of the voltage booster circuit 230 to receive the second supply voltage Vdd, a clock input terminal 312, and an output terminal 313. The input circuit 310 includes two transistors 315 and 316 whose drains are connected together to the supply input terminal 311, and whose sources are connected together to the output terminal 313. The control gate of the transistor 315 is connected through its drain to form a diode. The control gate of the transistor 316 is connected to the clock input terminal 312. The unit formed by the transistors 315 and 316 thus forms a CMOS switch controlled by a signal received at the clock input terminal 312. The inputs E1 and E2 of the elementary cells CE1 are connected together to the output terminal 313 of the input circuit 310.

The output circuit 320 has two input terminals 321 and 322 connected respectively to the output terminals S1 and S2 of the elementary cell CEN. The output circuit 320 also has a supply input terminal 323 connected to the power input terminal 232 of the voltage booster circuit 230 to receive the second supply voltage Vdd, a clock input terminal 324, and an output terminal 325 to give a high voltage HV. The output circuit 320 includes a transistor 326 and two capacitors 327, 328.

The drain and the control gate of the transistor 326 are connected together to the input terminal 321 and to the output terminal 325 of the output circuit 320. The source of the transistor 326 is connected to a terminal of the capacitor 327 and to the input terminal 322. The other terminal of the capacitor 327 is connected to the clock input terminal 324. A terminal of the capacitor 328 is connected to the drain of the transistor 326, and its other terminal is connected to the supply input terminal 323.

The control circuit 330 has a clock input terminal 331 to which a clock signal OSC is applied. The control circuit 330 also has two supply input terminals 332 and 333, connected respectively to the input terminals 231 and 232, to which the first and second supply voltages Vcc, Vdd are applied, respectively. At six clock output terminals 334 to 339, the control circuit 330 produces four selection switch signals FN, FBN, FX, FBX and two logic signals POL1N, POL2N representing the logic state of the selection switch signals FN, FX.

The oscillator 340 has an input terminal to which the supply voltage Vcc is applied and an output terminal connected to the input terminal 331 of the control circuit to give the clock signal OSC. The clock inputs CK1 and CK2 of the elementary odd-parity cells between 1 and m are connected to the clock output terminals 334 and 335 of the control circuit 330 to receive the selection switch signals FN and FBN. The clock inputs CK1 and CK2 of the elementary even-parity cells between 1 and m are connected to the clock output terminals 336 and 337 of the control circuit 330 to receive the selection switch signals FX and FBX.

The clock inputs CK1 and CK2 of the elementary odd-parity cells between m+1 and N are connected respectively to the clock output terminal 338 by an inverter Inv1, and to the clock output terminal 335 of the control circuit 330. The clock input CK1 of the elementary odd-parity cells between m+1 and N thus receive the logic signal POL1n inverted by the inverter Inv1. Their clock input CK2 receives the selection switch signal FBN.

Furthermore, the clock inputs CK1 and CK2 of the elementary even-parity cells between m+1 and N are connected respectively to the clock output terminal 339 by an inverter Inv2 and to the clock output terminal 337 of the control circuit 330. The clock input CK1 of the elementary even-parity cells between m+1 and N thus receives the clock signal POL2N inverted by the inverter Inv2. Their clock input CK2 receives the selection switch signal FBX.

Figure 1C:
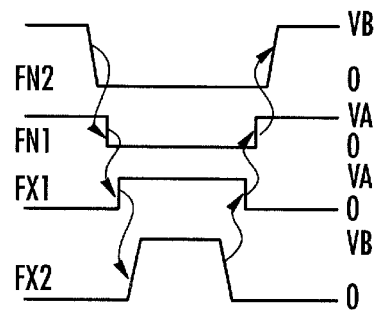

In the example of FIG. 3 described above, m has been chosen as an even-parity integer. The even-parity m-ranking elementary cell CEm thus receives the signals FX and FBX at its clock input terminals CK1 and CK2. Even so, this is only a one example of the invention, and those of skill in the art will appreciate that m may be chosen to be an odd-parity value, for example. In this case, the elementary odd-parity m-ranking cell CEm receives the signals FN and FBN at its clock input terminals CK1 and CK2. The selection switch signals FN and FX are identical to the signals FN1 and FX1 of FIG. 1*c*. They are complementary and non-overlapping in the high state and they switch between two values, namely 0 and a first voltage level VA which is equal to the first supply voltage Vcc.

According to the invention, the selection switch signals FBN and FBX are two signals respectively synchronized on the selection switch signals FN and FX and switching between two values. These two values are 0 and a second voltage value VB equal, in one example, to twice the supply voltage Vdd, and the second supply voltage Vdd is higher than the first supply voltage Vcc.

Figure 4:
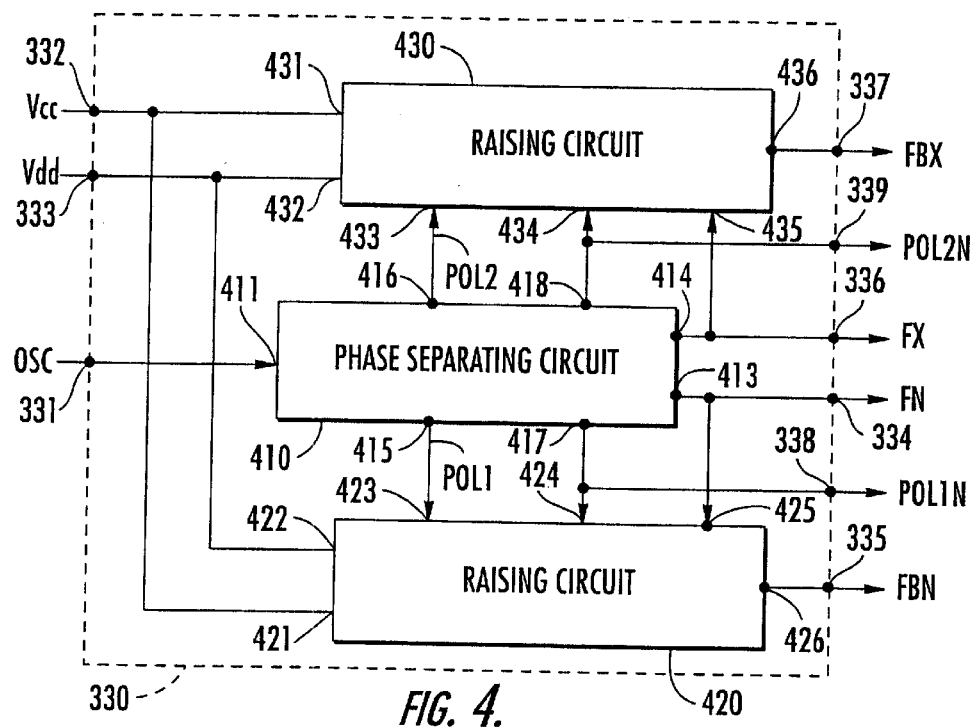

As seen in FIG. 4, the control circuit 330 includes a phase separation circuit 410 and two raising circuits 420 and 430. The phase separation circuit 410 has an input terminal 411 connected to the clock input terminal 331 to receive the clock signal OSC. The phase separation circuit 410 also has six output terminals 413 to 418 providing the selection switch signals FN and FX, as well as four logic signals POL1, POL2, POL1N, POL2N. The signals POLL and POL1N represent the logic state of the selection switch signal Fn, and the signals POL2 and POL2N represent the logic state of the selection switch signal FX. The output terminals 417 and 418 of the phase separation circuit 410 are connected to the output terminals 338 and 339 of the control circuit 330.

The first raising circuit 420 has two supply input terminals 421 and 422 connected, respectively, to the supply input terminals 332 and 333. The first raising circuit 420 also has three input terminals 423, 424, and 425 connected respectively to the output terminals 415, 417, and 413 of the phase separation circuit 410 to receive respectively the signals POL1, POL1N and FN. The first raising circuit 420 produces the selection switch signal FBN on an output terminal 426, which is connected to the output terminal 335 of the control circuit 330.

Similarly, the second raising circuit 430 has two supply input terminals 431 and 432 connected respectively to the supply input terminals 332 and 333. Furthermore, the second raising circuit 430 has three input terminals 433, 434, and 435 connected respectively to the output terminals 416, 418, and 414 of the phase separation circuit 410 to receive the signals POL2, POL2N, and FX. The second raising circuit 430 produces the selection switch signal FBX on an output terminal 436 connected to the output terminal 337 of the control circuit 330.

Figure 5:
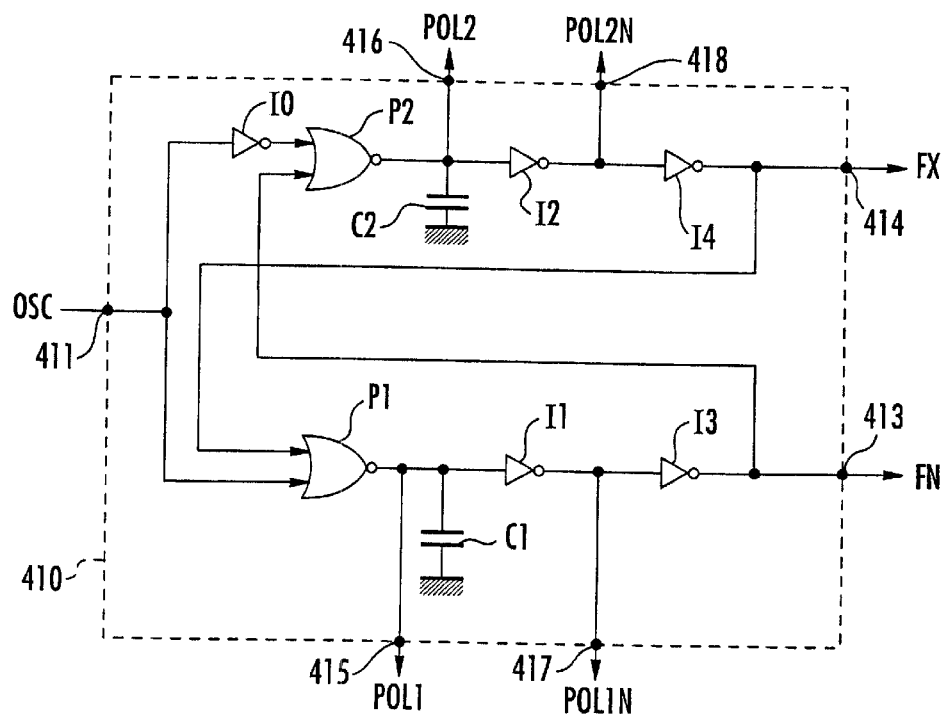

The phase separation circuit 410, as seen in FIG. 5, includes two logic gates P1 and P2 which are, for example, NAND type gates. The NAND gates P1 and P2 each have two input terminals and one output terminal. The input terminals of the logic gate P1 are connected respectively to the input terminal 411 to receive the clock signal OSC and to the output terminal 414 of the phase separation circuit 410. The output terminal of the logic gate P1 is connected to the output terminal 415 to provide the signal POL1 and to a terminal of a capacitor C1. The other terminal of the capacitor C1 is connected to a ground of the control circuit 330.

The input terminals of the logic gate P2 are connected respectively to the input terminal 411 by an inverter I0 and to the output terminal 413 of the phase separation circuit 410. The output terminal of the logic gate P2 is connected to the output terminal 416 to give a signal POL2 and to a terminal of a capacitor C2. The other terminal of the capacitor C2 is connected to the ground of the control circuit 330.

The phase separation circuit 410 also includes four inverters I1 to I4, each having an input terminal and an output terminal. The inverters I3 and I4 are chosen to be identical, respectively, to the inverters Inv1 and Inv2. The inverters I1 and I3 are series-connected. That is, the input terminal of the inverter I1 being connected to the output terminal of the logic gate P1 and the output terminal of the inverter I3 being connected to the output terminal 413 of the phase separation circuit 410 to provide the selection switch signal FN. Furthermore, the output terminal of the inverter I1 and the input terminal of the inverter I3 are connected together to the output terminal 417 of the phase separation circuit 410 to provide the signal POL1N. The signal applied to the clock input terminal CK1 of the odd-parity elementary cells between m+1 and N (i.e., the signal POL1N inverted by the inverter Inv1) is identical to the selection switch signal FN if the inverters Inv1 and I3 are chosen to be identical.

The inverters I2 and I4 are series-connected. That is, the input terminal of the inverter I2 is connected to the output terminal of the logic gate P2, and the output terminal of the inverter I4 is connected to the output terminal 414 of the phase separation circuit 410 to provide the selection switch signal FX. The output terminal of the inverter I2 and the input terminal of the inverter I4 are connected together to the output terminal 418 of the phase separation circuit 410 to provide the signal POL2N. The signal applied to the clock input terminals CK2 of the even-parity elementary cells between m+1 and N (i.e., the signal POL2N inverted by the inverter Inv2) is identical to the selection switch signal FX if the inverters Inv2 and I4 are chosen to be identical.

Figures 6, 7, 8:
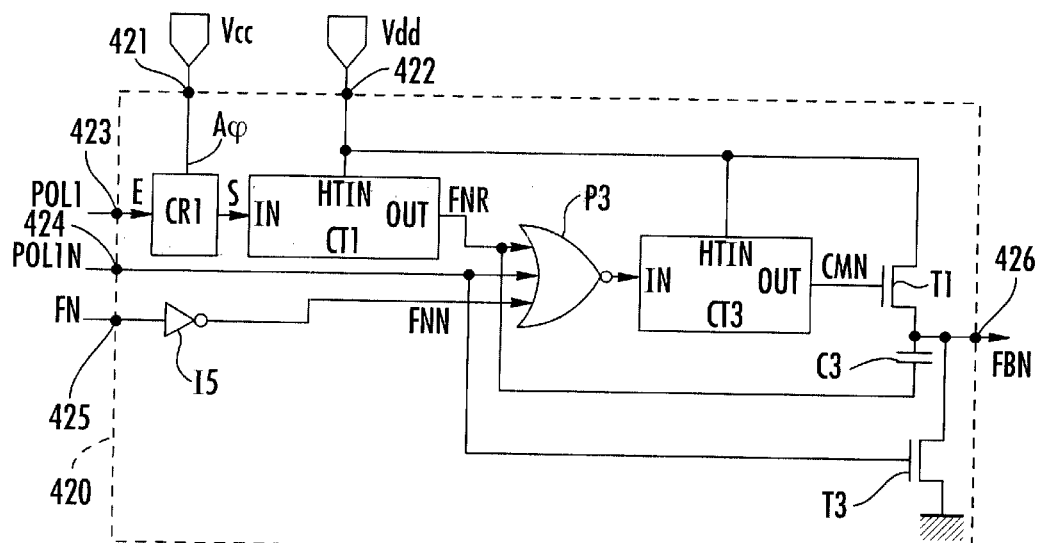

The first raising circuit 420, as shown in FIG. 6, includes a delay circuit CR1, two logic voltage translator circuits CT1 and CT3, two transistors T1 and T3, one capacitor C3, one logic gate P3, and one inverter I5. As shown in FIG. 8, a delay circuit CR1 has a supply input terminal A1 to which the first supply voltage Vcc is applied, an input terminal E, and an output terminal S. The drain and the source of a P-type transistor Tx are connected, respectively, to the supply input terminal and to a terminal of a resistor R. The drain and the source of the transistor Ty are respectively connected to the other terminal of the resistor R and to the ground of the circuit.

The control gate of the transistor Tx and the control gate of the transistor Ty are connected together to the input terminal E of the delay circuit CR1. A terminal of the capacitor C is connected to the ground of the circuit, and its other terminal is connected to the source of the transistor Tx and to the input terminal of an inverter I. An output terminal of the inverter Y is connected to the output terminal S of the delay circuit CR1. The delay circuit CR1 works as follows. At its output terminal S, it reproduces a signal which is applied to its input terminal E, delayed by a period of time TCR. An appropriate choice of the capacitance of the capacitor C and of the resistance R sets the value of the time TCR.

The logic voltage translator circuits CT1 and CT3 are identical. Each of them has a control input terminal IN, a supply input terminal HTIN to which the supply voltage Vdd is applied, and an output terminal OUT. A voltage translator circuit works as follows. When a logic signal equal to "0" is applied to its control input terminal IN, it produces a signal equal to "0" at its output terminal OUT. Inversely, when a logic signal equal to "1" is applied to its control input terminal IN, it produces a signal whose level is equal to the level of the signal applied to its supply input terminal HTIN. The voltage translator circuits CT1 and CT3 thus make it possible, from a low voltage logic signal (for example, a 3 V signal in the high state) to produce a logic signal with a higher voltage (for example, 5 V in the high state). The input terminal E of the delay circuit CR1 is connected to the input terminal 423 of the raising circuit 420 to receive the signal POL1. Its supply input terminal A1 is connected to the input terminal 421, and its output terminal S is connected to the control input terminal IN of the voltage translator circuit CT1.

The logic gate P3 has three input terminals respectively connected to the output terminal OUT of the voltage translator circuit CT1 to receive a signal FNR, to the input terminal 424 of the raising circuit 420 to receive a signal POL1N, and to the input terminal 425 of the raising circuit 420 through the inverter I5. The inverter I5 provides a signal FNN at its output terminal. The logic gate P3 also has an output terminal connected to the control input terminal IN of the voltage translator circuit CT3, whose supply input terminal HTIN is connected to the supply input terminal 422 to receive the supply voltage Vdd.

The output terminal OUT of the voltage translator circuit CT3 is connected to the control gate of the transistor T1 to give a signal CMN. The drain of the transistor T1 is connected to the supply input terminal 422. Its source is connected to the output terminal 426 to give the selection switch signal FBN and to a first terminal of the capacitor C3. A second terminal of the capacitor C3 is connected to the output terminal OUT of the voltage translator circuit CT1. Also, the drain and the control gate of the transistor T3 are respectively connected to the output terminal 426 and the input terminal 424 of the raising circuit 420. The source of the transistor T3 is connected to the ground of the circuit.

The second raising circuit 430 is identical to the first raising circuit 420 and, as shown in FIG. 7, includes a delay circuit CR2, two logic voltage translator circuits CT2 and CT4, two transistors T2 and T4, a capacitor C4, a logic gate P4, and an inverter I6. The delay circuit CR2 is identical to the delay circuit CR1. Similarly, the logic voltage translator circuits CT2 and CT4 are identical to the circuits CT1 and CT3. Their supply input terminals HTIN are connected together to the input terminal 432 to receive the supply voltage Vdd.

The input terminal E of the delay circuit CR2 is connected to the input terminal 433 of the raising circuit 430 to receive the signal POL2. Its supply input A1 is connected to the input terminal 431, and its output terminal S is connected to the control input terminal IN of the voltage translator circuit CT2. The logic gate P4 has three input terminals respectively connected to the output terminal OUT of the logic voltage translator circuit CT2 to receive a signal FXR, to the input terminal 434 of the raising circuit 430 to receive the signal POL2N, and to the input terminal 435 of the raising circuit 430 by the inverter I6. The inverter I6 provides a signal FXN at its output terminal.

The logic gate P4 also has an output terminal connected to the control input terminal IN of the voltage translator circuit CT4, whose output terminal OUT is connected to the control gate of the transistor T2 to provide a signal CMX. The drain of the transistor T2 is connected to the supply input terminal 432. Its source is connected to the output terminal 436 to give the selection switch signal FBX, and to a first terminal of the capacitor C4 whose second terminal is connected to the output terminal OUT of the voltage translator circuit CT2. Additionally, the drain and the control gate of the transistor T4 are respectively connected to the output terminal 436 and to the input terminal 434 of the raising circuit 430. The source of the transistor T4 is connected to the ground of the circuit.

The working of the control circuit 330 will now be described with reference to FIGS. 9a to 9o, which are diagrams of the signals at different points of the circuit 330. The signals OSC, POL1, POL1N, FN, FNN, POL2, POL2N, FX and FXN are logic signals that get switched between a zero voltage and the first supply voltage Vcc, where Vcc is about 3 V, for example. The signals FN4, CMN, FXR and CMX are logic signals that get switched between a logic voltage and a supply voltage Vdd, which is about 5 V, for example. The selection switch signals FBN and FBX switch between a zero voltage and the second voltage level VB which is in the range of 2*Vdd.

For the following example, the following assumptions will be made. First, the signals OSC, POL1, FN, FNR, CMN, FBN, POL2, FXN, CMX and FBX are equal to a logic "0," (i.e., they are equal to zero). Also, the signals FX, POL1N, POL2N and FNN are equal to a logic "1" (i.e., they are at the voltage Vcc). Furthermore, the signal FXR is equal to a logic "1" (i.e., it is at the voltage Vdd). It will also be assumed that the inverters I1 to I6 are identical and introduce a slight delay, and that the capacitors C1 and C2 introduce delays δ1 and δ2.

The falling of the selection switch signal FX to "0" leads to the rising of the signal FXN to "1" with a slight delay δ introduced by the inverter I6. At the same time, the signal POL1 goes to "1" with a delay 1 introduced by the capacitor C1. The rising of the signal POLL to "1" leads to the falling of the signal POL1N to "0", the falling of the selection switch signal FN to "1" and the falling of the signal FNN to "0." The signals POL1N, FN and FNN change their state one after the other, each time with a slight delay due to the presence of the inverters I1, I3 and I5. The falling of the selection switch signal FX to "0" thus leads to the rising of the signal FN to "1" with a delay Δ1=δ1+2*δ due to the capacitor C1 and the inverters I1 and I3.

Since the signals FN4 and POL1N are at zero, the falling of the signal FNN to "0" leads to a change in state at the output terminal of the gate P3 and the rising of the signal CMN to "1" by the voltage translator circuit CT3. The signal CMN is thus taken to the voltage Vdd turning the transistor T1 on, and the selection switch signal FBN is taken to the voltage Vdd. Furthermore, since the signal POL1N is equal to "0," one of the terminals of the capacitor C3 is at a voltage zero, but its other terminal is at the voltage Vdd. The capacitor C3 is therefore charged.

At the same time, the rising of the signal POLL to "1" causes the rising of the signal FNR to "1" with a delay due to the presence of the delay circuit CR1. The signal FNR is therefore taken to the voltage Vdd by the action of the voltage translator circuit CT1. Since the signal FNR is at the voltage Vdd, the output of the logic gate P3 changes its state, the signal CMN goes to "0" and the transistor T1 goes off. With the capacitor C3 being charged and the signal FNR being taken to the voltage Vdd, the other terminal of the capacitor C3 climbs to the voltage VB=2*Vdd, as does the selection switch signal FBN.

Shortly thereafter, the signal OSC goes from "0" to "1," the output of the logic gate P1 changes its state, and the signal POLL goes to "0" with a delay δ1 introduced by the capacitor C1. The falling of the signal POL1 to "0" causes the rising of the signal POL1N to "1", the falling of the signal FN to "0," and the rising of the signal FNN to "1." The signals POL1N, FN and FNN change their state successively, each time with a small delay δ due to the presence of the inverters I1, I3 and I5. The change in state of the signal OSC thus causes a change in state of the selection switch signal FN with a delay Δ1=δ1+2*δ, due to the capacitor C1 and the inverters I1 and I3.

The falling of the selection switch signal FN to "0" causes the rising of the signal FNN to "1" with a slight delay δ introduced by the inverter I5. At the same time, the signal POL2 at the output of the logic gate P2 goes to "1" with a delay δ2 introduced by the capacitor C2. The rising of the signal POL2 to "1" leads to the falling of the signal POL2 to "0", the rising of the selection switch signal FX to "1," and the falling of the signal FXN to "0." The signals POL2N, FX and FXN change their state one after the other, each time with a slight delay δ due to the presence of the inverters I2, I4 and I6. The falling of the selection switch signal FN to "0" thus leads to the rising of the signal FX to "1" with a delay Δ2=δ2+2*δ, due to the capacitor C2 and the inverters I2 and I4.

Since the signals FX4 and POL2N are zero, the passage to "0" of the signal FXN causes a change in state at the output terminal of the gate P4 and the passage to "1" of the signal CMX by the voltage translator circuit CT4. The signal CMX is therefore taken to the voltage Vdd, thus turning the transistor T2 on, and the selection switch signal FBX is taken to the voltage Vdd. Furthermore, since the signal POL2N is equal to "0", one of the terminals of the capacitor C4 is at a zero voltage, its other terminal being at the voltage Vdd. The capacitor C4 therefore gets charged.

At the same time, the rising of the signal POL2 to "1" causes the rising of the signal FXR to "1" with a delay due to the presence of the delay circuit CR2. The signal FX is therefore taken to the voltage Vdd by the action of the voltage translator circuit CT2. Since the signal FX is at the voltage Vdd, the output of the logic gate P4 changes its state, the signal CXN goes to "0" and the transistor T2 shuts off. With the capacitor C4 being charged and the signal FXR being taken to the voltage Vdd, the other terminal of the capacitor C4 climbs to the voltage VB=2*Vdd, as does the selection switch signal FBX.

Shortly thereafter, the signal OSC goes from "0" to "1," the output of the logic gate P2 changes its state, and the signal POL2 goes to "0" with a delay δ1 introduced by the capacitor C2. The falling of the signal POL2 to "0" causes the rising of the signal POL2N to "1", the falling of the signal FX to "0," and the rising of the signal FXN to "1." The signals POL2N, FX and FXN change their state successively, each time with a small delay due to the presence of the inverters I2, I4 and I6. The change in state of the signal OSC thus causes a change in state of the selection switch signal FX with a delay Δ2=δ2+2*δ, due to the capacitor C2 and the inverters I2 and I4. The control circuit 200 has then returned to its initial state.

According to another embodiment of the charge pump of the invention, it is possible to supply power to all the elementary cells of the charge pump either by the selection switch signals FN and FBN or by the selection switch signals FX and FBX. For this purpose, the inverters Inv1, Inv2, as well as the output terminals 338, 339 of the control circuit 330 along with the connections of these output terminals to the elementary cells CEm+1 to CEN, are eliminated. Thus, the clock inputs CK1 and CK2 of the odd-parity elementary cells ranging from m+1 to N are respectively connected to the clock output terminals 334 and 335 of the control circuit 330 to receive the selection switch signals FN and FBN. Also, the clock inputs CK1 and CK2 of the even-parity elementary cells ranging from m+1 to N are respectively connected to the clock output terminals 336 and 337 of the control circuit 330 and receive the selection switch signals FX and FBX. The 1 to m ranking elementary cells receive the same signals as noted above.

The above embodiment performs less well than the embodiment of FIG. 3. The reason is that if the inverters Inv1 and Inv2 are eliminated, the currents that go through them to supply the elementary circuits CEm+1 to CEN get added up with the currents crossing the inverters I3 and I4. The inverters I3 and I4 should therefore have bigger dimensions to take higher power values as well as stronger current spikes during the change in logic state of the inverters I3 and I4.

The invention may be further improved by eliminating the oscillator 340 of the voltage booster circuit 230 and replacing it with a clock signal generator 250 (shown in dashes in FIG. 2). The clock signal generator 250 has an input terminal connected to the output terminal 211 of the detection and rectifier circuit 210 and an output terminal connected to the clock input terminal 233 of the voltage booster circuit 230. From the rectified voltage VR, the clock signal generator 250 provides a clock signal OSC with a frequency $f=f0/p$, where f0 is the frequency of the radio frequency signal SR received by the card and p is an integer. Conventionally, f0 is equal to 13.56 MHZ. By choosing p=8, for example, a clock signal with a frequency $f=1.7$ MHZ is obtained.

A clock signal generator of this kind has the advantage of being particularly stable in frequency to the extent that the frequency f0 of the radio frequency signal SR sent by the reader is stable. Thus, the problems of stability of the standard oscillator 340 are substantially overcome.

That which is claimed is:

1. An integrated circuit card comprising:
   a voltage generator receiving power from a wireless radio frequency signal and generating first and second voltages, the second voltage being higher than the first voltage; and
   a voltage booster circuit having first and second inputs, said voltage booster circuit receiving the first voltage at the first input and the second voltage at the second input and producing a boosted voltage.

2. The integrated circuit card according to claim 1 wherein said voltage generator comprises:
   a detection and rectifier circuit receiving the wireless radio frequency signal and producing a rectified voltage at an output thereof; and
   a first regulator receiving the rectified voltage at an input thereof and producing the first voltage, the second voltage being equal to the rectified voltage.

3. The integrated circuit card according to claim 1 wherein said voltage booster circuit comprises a control circuit producing first and second selection switch signals, the first selection switch signal oscillating between zero and a first voltage level and the second selection switch signal oscillating between zero and a second voltage level.

4. The integrated circuit card according to claim 1 wherein said voltage generator comprises:
   a detection and rectifier circuit receiving the wireless radio frequency signal and producing a rectified voltage;
   a first regulator receiving the second voltage and producing the first voltage; and
   a second regulator receiving the rectified voltage and producing the second voltage.

5. The integrated circuit card according to claim 3 wherein said control circuit receives the first and second voltages; and wherein the first and second voltage levels are respectively obtained from the first and second voltages.

6. The integrated circuit card according to claim 3 wherein said voltage booster circuit comprises N series-connected elementary cells for producing the boosted voltage; and wherein said N elementary cells are controlled by a plurality of selection switch signals comprising at least the first and second selection switch signals.

7. The integrated circuit card according to claim 3 wherein said control circuit comprises:
   a phase separation circuit receiving a clock signal and the first voltage and producing the first selection switch signal; and
   at least one raising circuit receiving the first selection switch signal and the first and second voltages and producing the second selection switch signal by raising the level of the first selection switch signal.

8. The integrated circuit card according to claim 7 wherein said phase separation circuit produces at least one logic signal representing a logic state of the first selection switch signal.

9. The integrated circuit card according to claim 7 wherein said at least one raising circuit comprises:
   at least one capacitor having first and second terminals;
   an inverter to delay the first selection switch signal;
   at least one first transistor for precharging the second terminal of the at least one capacitor to the second voltage;
   a translator circuit receiving the delayed first selection switch signal and raising a voltage level at the second terminal of the at least one capacitor; and
   at least one second transistor for bringing the voltage level at the second terminal of the at least one capacitor to zero, the second selection switch signal being provided at the second terminal of the at least one capacitor.

10. The integrated circuit card according to claim 7 further comprising a clock signal generator receiving the second voltage and producing the clock signal.

11. The integrated circuit card according to claim 8 wherein at least one of said N elementary cells is driven by the first and second selection switch signals; and wherein at least one other of said N elementary cells is driven by the second selection switch signal and the at least one logic signal.

12. The integrated circuit card according to claim 8 wherein said N elementary cells are driven by the first selection switch signal and the second selection switch signal.

13. An integrated circuit card comprising:
   a detection and rectifier circuit receiving a wireless radio frequency signal and producing a rectified voltage therefrom at an output thereof;
   at least one regulator receiving the rectified voltage and producing first and second voltages, the second voltage being higher than the first voltage; and
   a voltage booster circuit having first and second inputs, said voltage booster circuit receiving the first voltage at the first input and the second voltage at the second input and producing a boosted voltage.

14. The integrated circuit card according to claim 13 wherein the second voltage is equal to the rectified voltage.

15. The integrated circuit card according to claim 13 wherein said voltage booster circuit comprises a control circuit producing first and second selection switch signals, the first selection switch signal oscillating between zero and a first voltage level and the second selection switch signal oscillating between zero and a second voltage level.

16. The integrated circuit card according to claim 15 wherein said voltage booster circuit comprises N series-connected elementary cells for producing the boosted voltage; and wherein said N elementary cells are controlled by a plurality of selection switch signals comprising at least the first and second selection switch signals.

17. The integrated circuit card according to claim 15 wherein said control circuit receives the first and second voltages; and wherein the first and second voltage levels are respectively obtained from the first and second voltages.

18. The integrated circuit card according to claim 15 wherein said control circuit comprises:
   a phase separation circuit receiving a clock signal and the first voltage and producing the first selection switch signal; and
   at least one raising circuit receiving the first selection switch signal and the first and second voltages and producing the second selection switch signal by raising the level of the first selection switch signal.

19. The integrated circuit card according to claim 18 wherein said phase separation circuit produces at least one logic signal representing a logic state of the first selection switch signal.

20. The integrated circuit card according to claim 18 wherein at least one of said N elementary cells is driven by the first and second selection switch signals; and wherein at least one other of said N elementary cells is driven by the second selection switch signal and the at least one logic signal.

21. The integrated circuit card according to claim 18 wherein said at least one raising circuit comprises:
   at least one capacitor having first and second terminals;
   an inverter to delay the first selection switch signal;
   at least one first transistor for precharging the second terminal of the at least one capacitor to the second voltage;
   a translator circuit receiving the delayed first selection switch signal and raising a voltage level at the second terminal of the at least one capacitor; and
   at least one second transistor for bringing the voltage level at the second terminal of the at least one capacitor to zero, the second selection switch signal being provided at the second terminal of the at least one capacitor.

22. The integrated circuit card according to claim 18 further comprising a clock signal generator receiving the rectified voltage and producing the clock signal.

23. The integrated circuit card according to claim 19 wherein said N elementary cells are driven by the first selection switch signal and the second selection switch signal.

24. A method for providing a boosted voltage greater than a supply voltage in an integrated circuit card and comprising:

detecting and rectifying a wireless radio frequency signal to provide a rectified voltage;
   regulating the rectified voltage to produce first and second voltages therefrom, the second voltage being higher than the first voltage; and
   generating the boosted voltage from the first and second voltages.

25. The method according to claim 24 wherein regulating comprises regulating the rectified voltage so that the second voltage is equal to the rectified voltage.

26. The method according to claim 24 wherein generating comprises:
   producing first and second selection switch signals, the first selection switch signal oscillating between zero and a first voltage level and the second selection switch signal oscillating between zero and a second voltage level; and
   controlling N series-connected elementary cells with the first and second selection switch signals to generate the boosted voltage.

27. The method according to claim 26 wherein producing the first and second switch signals comprises:
   generating the first selection switch signal from a clock signal and the first voltage; and
   raising a level of the first selection switch signal to produce the second selection switch signal.

28. The method according to claim 27 wherein raising comprises:
   delaying the first selection switch signal;
   precharging a terminal of a capacitor to the second voltage;
   receiving the delayed first selection switch signal and raising a voltage level at the terminal of the capacitor; and
   bringing the voltage level at the terminal of the capacitor to zero.

29. The method according to claim 27 further comprising producing at least one logic signal representing a logic state of the first selection switch signal.

30. The method according to claim 29 further comprising driving at least one of the N elementary cells with the first and second selection switch signals, and driving at least one other of the N elementary cells is driven by the second selection switch signal and the at least one logic symbol.

31. The method according to claim 29 further comprising driving the N elementary cells with a plurality of selection switch signals comprising at least the first selection switch signal and the second selection switch signal.

* * * * *

UNITED STATES PATENT AND TRADEMARK OFFICE
CERTIFICATE OF CORRECTION

PATENT NO. : 6,437,609 B1
DATED : August 20, 2002
INVENTOR(S) : Mohamad Chehadi

It is certified that error appears in the above-identified patent and that said Letters Patent is hereby corrected as shown below:

Column 6,
Line 40, delete "POLL" insert -- POL1 --

Column 9,
Line 55, delete "POLL" insert -- POL1 --

Column 10,
Line 1, delete "POLL" insert -- POL1 --

Signed and Sealed this

Twenty-fifth Day of February, 2003

JAMES E. ROGAN
*Director of the United States Patent and Trademark Office*